United States Patent [19]
Acosta et al.

[11] Patent Number: 6,009,143
[45] Date of Patent: Dec. 28, 1999

[54] MIRROR FOR PROVIDING SELECTIVE EXPOSURE IN X-RAY LITHOGRAPHY

[75] Inventors: Raul Edmundo Acosta; Jerome Paul Silverman, both of White Plains; Raman Gobichettipalayam Viswanathan, Briarcliff Manor, all of N.Y.

[73] Assignee: International Business Machines Corporation, Armonk, N.Y.

[21] Appl. No.: 08/907,438

[22] Filed: Aug. 8, 1997

[51] Int. Cl.⁶ .................................................. G21K 5/00
[52] U.S. Cl. ............................................ 378/34; 378/85
[58] Field of Search ........................................ 378/34, 85

[56] References Cited

U.S. PATENT DOCUMENTS

| | | |
|---|---|---|
| 4,587,184 | 5/1986 | Schnieder-Gmelch et al. . |
| 5,111,491 | 5/1992 | Imai et al. . |
| 5,115,456 | 5/1992 | Kimura et al. . |
| 5,227,268 | 7/1993 | Koga et al. . |
| 5,235,626 | 8/1993 | Flamholz et al. . |
| 5,439,781 | 8/1995 | MacDowell et al. ............... 378/34 |
| 5,459,001 | 10/1995 | Estes et al. . |
| 5,572,562 | 11/1996 | Rostoker et al. . |
| 5,593,800 | 1/1997 | Fujioka et al. . |

FOREIGN PATENT DOCUMENTS

| | | |
|---|---|---|
| 4240716 | 8/1992 | Japan . |
| 4294519 | 10/1992 | Japan . |
| 4-315417 | 11/1993 | Japan . |

OTHER PUBLICATIONS

"X–Ray Exposure Mask", Patent Abstracts of Japan vol. 8, No. 81 (Apr. 1984).

*Primary Examiner*—Craig E. Church
*Attorney, Agent, or Firm*—Daniel P. Morris; Anne Vachon Dougherty

[57] ABSTRACT

An inventive mirror system for use in providing reflected X-ray radiation to a mask having pattern areas and opaque areas, comprising a plurality of parallel mirror segments which are vertically positioned with respect to each other at distances approximately equal to the widths of the corresponding opaque mask areas. In operation, radiation incident on each of the mirror segments is reflected to the patterned feature areas of the mask and skips over the opaque mask areas.

21 Claims, 5 Drawing Sheets

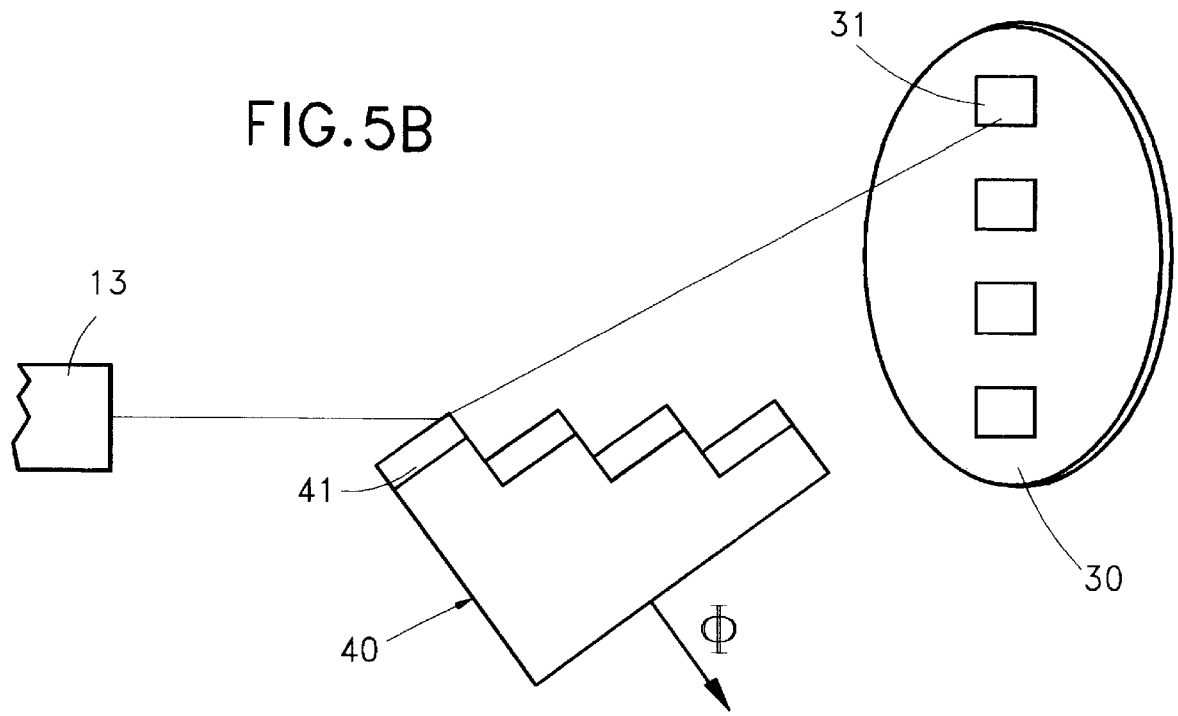
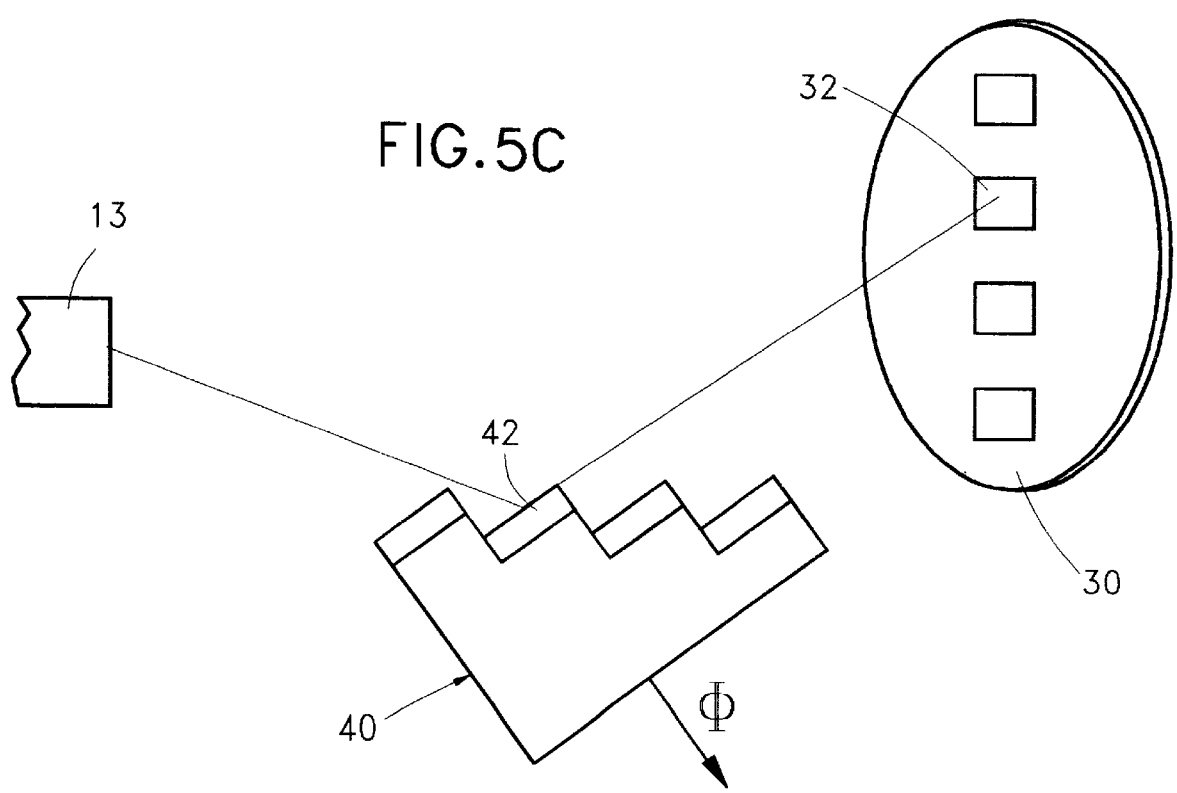

MIRROR FOR PROVIDING SELECTIVE EXPOSURE IN X-RAY LITHOGRAPHY

FIELD OF THE INVENTION

This invention relates generally to the field of x-ray lithography and more specifically to a mirror system for use with X-ray lithography to irradiate workpieces through masks having multiple exposure feature areas separated by opaque regions.

BACKGROUND OF THE INVENTION

Lithography has been utilized for semiconductor device fabrication for decades. Radiation-sensitive resist material is deposited on a semiconductor workpiece and it is exposed to radiation from an energy source through a patterned mask. The workpiece is subsequently processed (including development of the resist, selective removal of either the developed resist or of the non-exposed resist material, deposition of metal in selectively-exposed areas, etc.) to create a pattern of features needed for the semiconductor device. The implementation of lithography in the semiconductor field has advanced from the use of photolithography for larger-scale features to the use of shorter wavelength radiation sources to fabricate higher density circuitry having smaller features. Synchrotron X-ray radiation is one of the preferred energy sources for providing high density patterns of features on semiconductors. Due to the fact that synchrotron X-ray radiation is produced as a broad horizontal beam having a small vertical spread, the wide beam is scanned along the length of a mask overlaying a workpiece to expose successive vertically-disposed sites on the workpiece. The use of the term "vertical" is used herein in accordance with the common parlance in the industry. It will be clear to those having skill in the art that use of the term "vertical" does not mean that the workpiece could not be mounted at any orientation other than vertical in the exposure system; but, rather that the scan is conducted perpendicular to the plane of the mask to effect irradiation through all of the mask feature areas.

In X-ray lithography systems, of the type illustrated in FIG. 1, radiation from the synchrotron source, 13, is first directed to a mirror, 15, at a shallow angle of incidence, $\alpha$. The incident angle, $\alpha$ is chosen to be in the range of 25 mradians in order to maximize reflectivity of the radiation. The reflected radiation is provided at the patterned mask, 11, and, through the X-ray transparent sections of the mask, to the resist-coated workpiece, 10. In order to scan the radiation vertically along the mask and the workpiece, hereinafter referred to as the "mask-workpiece combination," the mirror may either be rocked, so as to change the angle of incidence of the radiation, or it may be displaced vertically while keeping the angle of incidence constant. Rocking of the mirror is an option, however, since the reflectivity of the mirror is a strong function of the angle of incidence, the intensity of the reflected beam can vary as the beam is scanned vertically over the mask-workpiece combination. Such variation in the intensity of the beam across a workpiece may lead to unacceptable variations in the amount of exposure. Using vertical displacement of the mirror, such that the X-ray radiation is provided at various points along mirror length L, and the reflected radiation is vertically displaced along a section of the face of the mask-workpiece combination, provides a predictable amount of radiation across the entire surface of the mask-workpiece combination.

FIGS. 2a through 2c show, in schematic form, the scanning operation of the prior art systems. When mirror 15 is in a first position, $P_a$, with respect to the synchrotron X-ray source, the incident beam is reflecting off of the mirror at a point $M_a$, and being provided to the mask-workpiece combination at a point $W_a$, as illustrated in FIG. 2a. As the mirror is "vertically" displaced, in a direction perpendicular to its planar mirror face, to the position denoted at $P_b$ in FIG. 2b, the incident beam is contacting the mirror at point $M_b$ and being provided to the mask-workpiece combination at point $W_b$. Finally, when the mirror is located at position $P_c$, as in FIG. 2c, the X-ray beam contacts the mirror at point $M_c$ and the mask-workpiece combination at $W_c$. While there are many positions along the mirror length, L, positions $P_a$, $P_b$ and $P_c$ are representatively depicted to illustrate the fact that while the radiation has been caused to traverse along mirror length L, the reflected beam has covered a continuously illuminated area of vertical height V on the mask-workpiece combination, which area may incorporate one or several mask features.

Because the vertical height scanned by the beam is given by the relation $V=L\times\alpha$, also stated as $V/\alpha=L$, and the angle of incidence $\alpha$ is very shallow, the length L of the mirror must be approximately 2000 mm in order to scan the reflected light across a workpiece dimension V of 50 mm. For accurate reflection of the radiation, the mirror must be perfectly planar over its entire length, which presents significant technical challenges, particularly at the aforementioned dimensions.

Prior art patents U.S. Pat. Nos. 5,234,626 of Flamholz, et al and 4,260,670 of Burns, both teach the use of masks having multiple apertures or mask pattern segments separated by opaque regions for exposing multiple chip sites. The Flamholz, et al patent additionally teaches use of the segmented mask in an X-ray scanning system. An improved mask structure has been disclosed in U.S. patent application Ser. No. 08/731,536 entitled "MEMBRANE MASK STRUCTURE, FABRICATION AND USE" by R. Acosta and R. Viswanathan, wherein one embodiment of the inventive mask comprises a two stage mask for two-step exposure, with the chip site patterns at each of the stages being separated by support segments. One drawback to the use of any of the foregoing masks is the fact that time and energy are being wasted while the radiation is scanning over opaque areas such as the support sections of the masks.

FIG. 3 shows a mask, 30, having four aperture segments, 31, 32, 33 and 34, separated by opaque regions. For ease of description (as well as for ease of fabrication and use in practice, though such is not strictly required), each of the mask segments in equal in vertical dimension v, and in separated by an opaque area of equal vertical dimension s. The indicators on the left of FIG. 3a represent the time intervals during which the scanned, reflected X-ray radiation is traversing each mask segment and each opaque region. Time intervals $T_1$, $T_3$, $T_5$ and $T_7$ each represent the time taken to traverse the mask pattern aperture segments 31, 32, 33 and 34, during which times the X-ray radiation is reaching the workpiece. During all of the other indicated $T_x$ intervals, the energy is being wasted, and the ultimate throughput of the system is being diminished. The vertical dimension of the entire mask feature area, including the opaque segments, is denoted as V, indicating the area traversed by reflected radiation from a scan of a mirror of length L.

The time periods are shown as equal, however, it is to be noted here that it is not required that each of the time periods represented by $T_x$ be equal in duration, or that the mirror scan be conducted at a constant rate. One solution to the time and energy waste would be to program a system to increase the rate of progress of the reflected beam over the opaque regions of dimensions s in order to minimize the compromised throughput. Such programming would be burdensome to enter into the system for each mask, and would be quite difficult to control.

In light of the foregoing discussion, it is desirable to provide a reflection system for X-ray lithography tools which would not require the use of large mirrors, which would optimize throughput time, and which would minimize waste of energy.

It is therefore an objective of the invention to provide an X-ray lithography mirror system having segments of relatively small dimensions in comparison to prior art, non-segmented mirrors.

It is another objective of the invention to provide an X-ray mirror lithography system which directs the radiation to the patterned feature areas of the mask, thereby avoiding unnecessary waste of energy over non-patterned opaque mask regions.

SUMMARY OF THE INVENTION

These and other objectives are realized in the present inventive mirror system, for use in directing reflected radiation, such as X-ray beams, to patterned masks having pattern feature areas and opaque areas. The mirror system comprises a plurality of mirror segments which are vertically positioned with respect to each other at distances approximately equal to the widths of the corresponding opaque mask areas. Radiation incident on each of the mirror segments is reflected to the patterned feature areas of the mask. The mirror segments may be disposed on a stepped substrate, preferably with parallel steps. As the incident radiation moves from one step to the next, the reflected radiation skips over the opaque mask area.

BRIEF DESCRIPTION OF THE DRAWINGS

The invention will now be described in greater detail with reference to the drawings wherein:

FIGS. 5a through 5e show, in schematic form, the scanning operation of an X-ray lithography system using the present inventive mirror system.

DESCRIPTION OF THE PREFERRED EMBODIMENT

Figure 1:
FIG. 1 schematically illustrates an X-ray lithography system for patterning semiconductors.
Figure 2A:
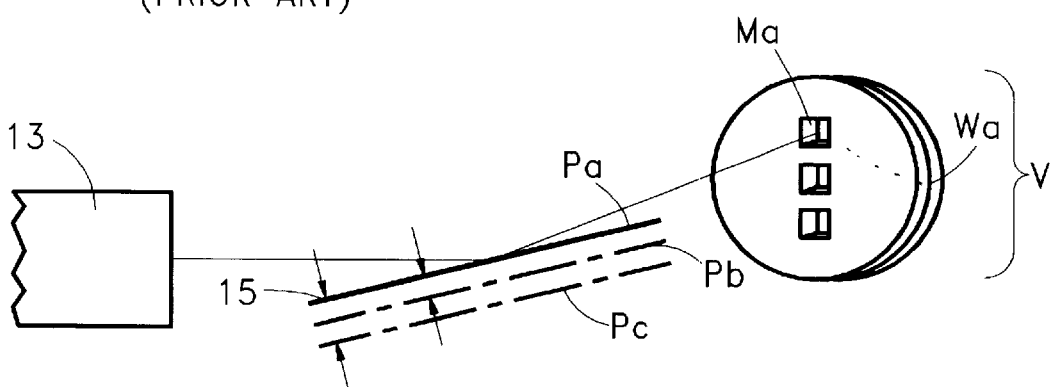
FIGS. 2a through 2c show in schematic form, the scanning operation of prior art X-ray lithography systems.
Figure 2B:
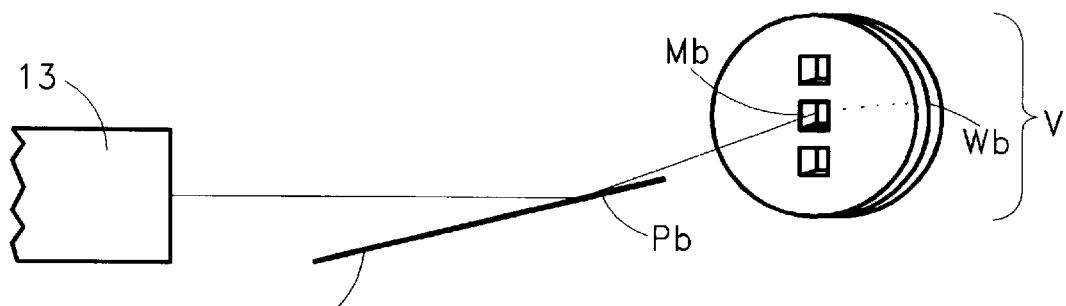
Figure 2C:
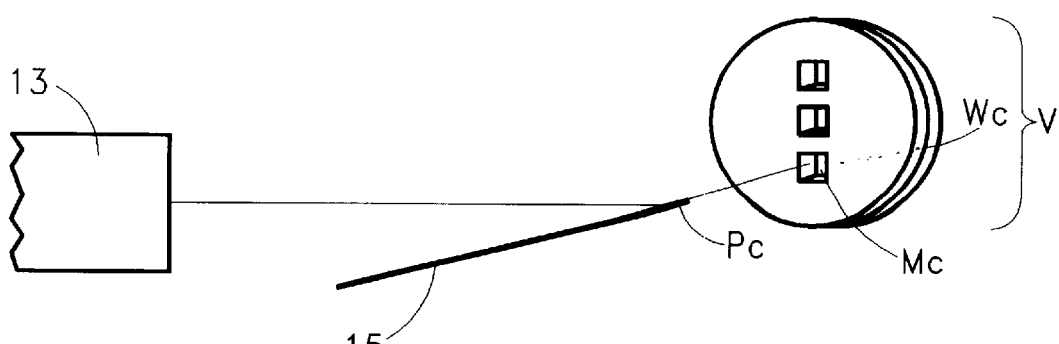
Figure 3:
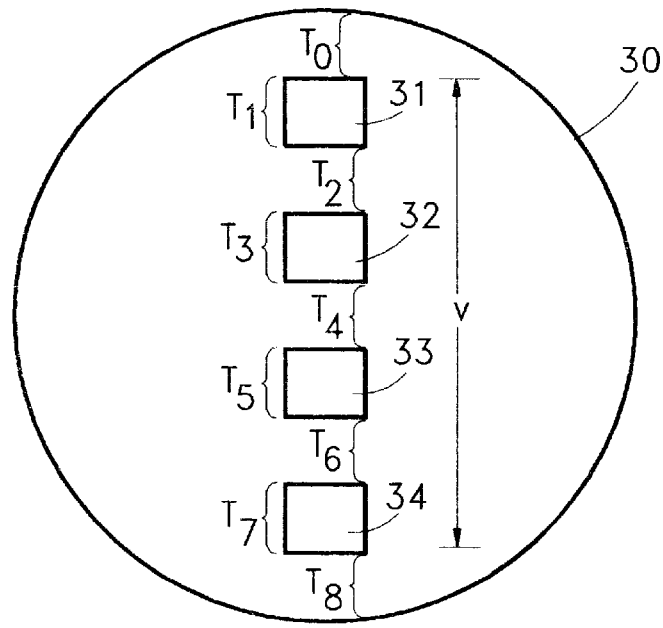
FIG. 3 depicts a mask having patterned areas and opaque areas along with the time intervals required to scan the mask areas using prior art X-ray lithography systems.
Figure 4:
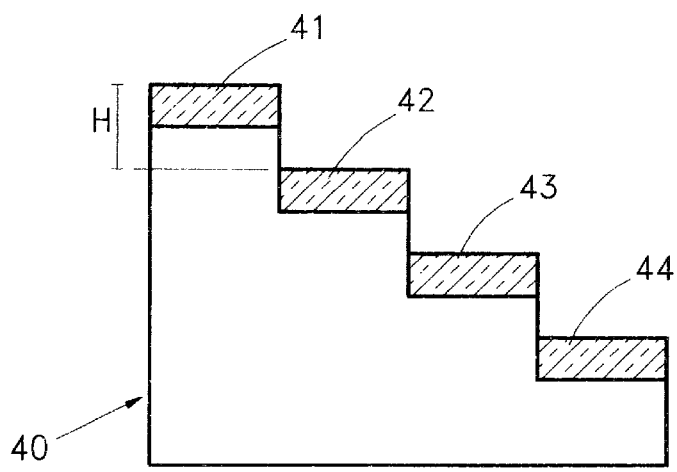
FIG. 4 provides an illustration of a mirror system in accordance with one embodiment of the present invention.

The inventive mirror system is illustrated in FIG. 4 wherein mirror segments 41–44 of length l are positioned parallel to each other, with each segment separated from the next by a vertical dimension H. The mirror segments may be independent or integrated into a stepped structure wherein each mirror segment forms, or is formed on, one of the steps of a supporting substrate. The mirror segment length l is selected to be proportional to the vertical dimension v of the corresponding mask feature area, e.g., segment 41 corresponding to patterned feature mask area 31 (of FIGS. 3 and 6), etc., based upon the relationship $v/\alpha=l$. In practice, it is preferable to use mirror segments of length $l>v/\alpha$, which will result in a slight overlap of the area of irradiation, thereby compensating for minor misalignment which may occur. The compensation or overlap can additionally allow the system to realize full exposure effects from a scan across the interior of the mirror, and not rely on a scan which incorporates the mirror edges, where edge effects can produce loss and/or distortion errors. The vertical dimension H between successive mirror segments is chosen to be proportional to the vertical dimension s of the opaque mask areas. Again, in practice, it will be prudent to compensate for potential misalignment by making H<s. Once again, the masks may not have features and opaque areas which are uniform in vertical dimension, however, it would be preferable that such be the case, particularly when fabricating mirror systems which would ideally be used with more than one mask. However, the invention may alternatively be implemented in such a way that the vertical height of each mirror segment may be independently adjusted, thereby allowing for customization of the mirror system to accommodate masks having different feature size and spacing.

The mirror system is oriented so that radiation will strike the face of each of the mirror segments at the optimal angle of incidence, α. As the mirror system is vertically displaced perpendicular to the plane of the mirror faces, the radiation will be incident on different positions along the length of each mirror segment, as with the single mirror displacement of the past, but will "jump" to the next successive mirror segment once it has traversed the length of the preceding mirror segment. As the incident radiation is "jumping" from one mirror segment to the next, the reflected radiation "jumps" over the corresponding opaque area of the mask.

Figure 5A:
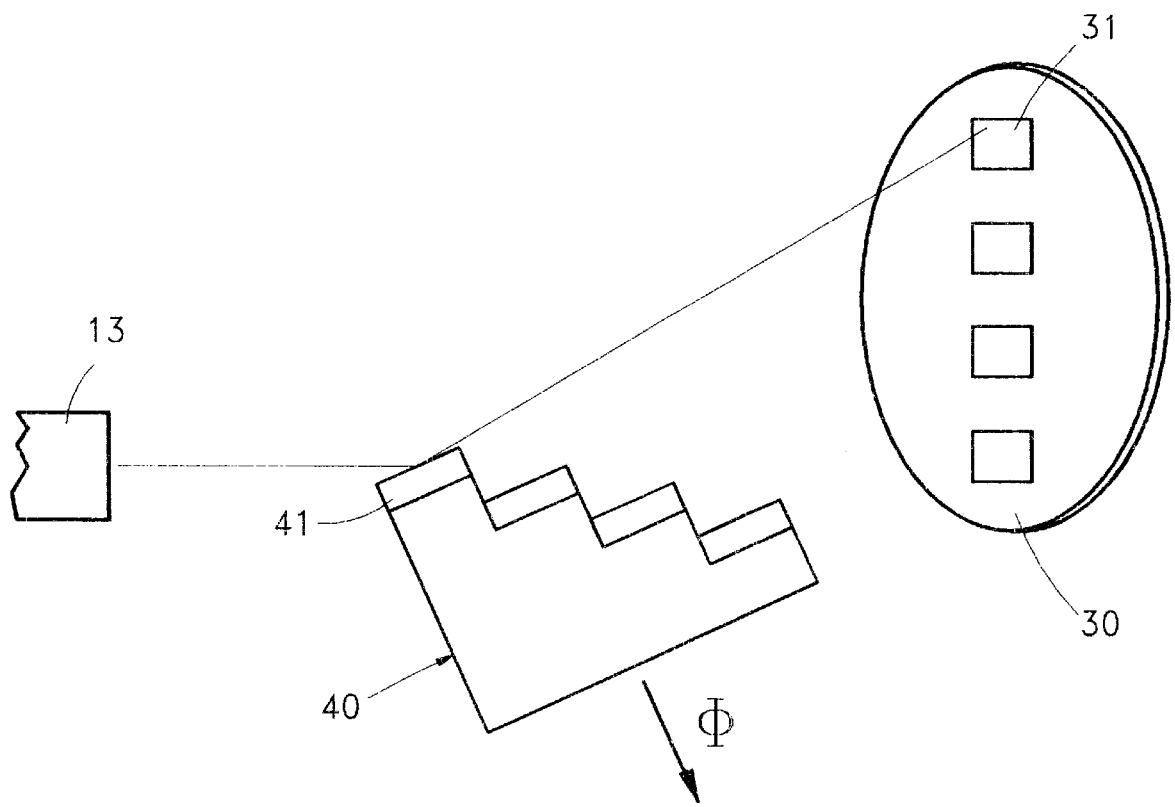

FIGS. 5a through 5e illustrate the inventive mirror system in use. Radiation from synchrotron X-ray source 13 is directed toward mirror system 40, which is inclined at an angle determined to provide the optimal angle of incidence α. In FIG. 5a, the radiation is incident at the leading edge of mirror segment 41, which directs reflected radiation onto mask 30 at approximately the leading, or upper, edge of mask feature 31. As the mirror system, 40, is displaced "vertically" (i.e., in the direction perpendicular to the plane of the mirror faces), shown by direction arrow Φ, the incident radiation moves along the length l of the face of mirror segment 41. Movement of the incident radiation results in movement of the reflected radiation along the vertical dimension v of feature 31 on the mask, until the incident radiation reaches the far edge of mirror segment 41, as illustrated in FIG. 5b. The next increment of vertical displacement of mirror system 40, as shown by FIG. 5c, results in the incident radiation striking the leading edge of mirror segment 42, with the resulting reflected radiation striking the mask 30 at approximately the leading or upper edge of mask feature 32. The opaque area on mask 30 between features 31 and 32, of vertical dimension s, receives no reflected radiation. That opaque area has been skipped by the reflected radiation due to the jump of the incident radiation across dimension H between mirror segments 41 and 42.

Figure 5D:
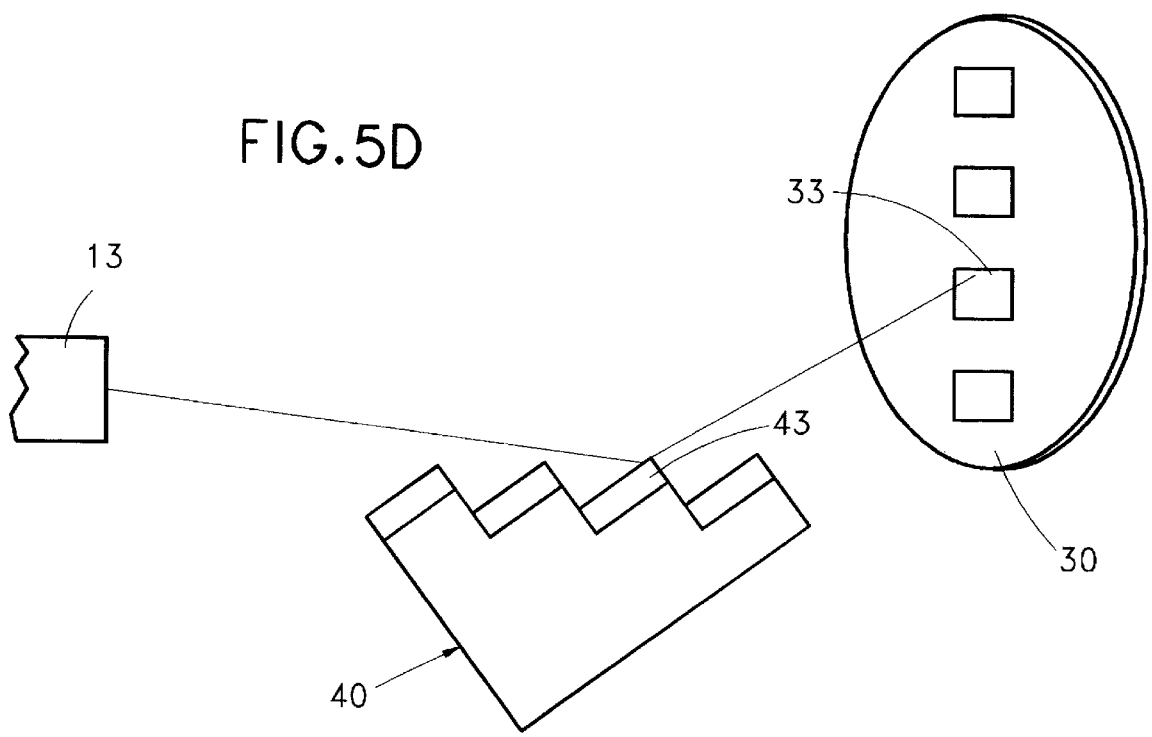
Figure 5E:
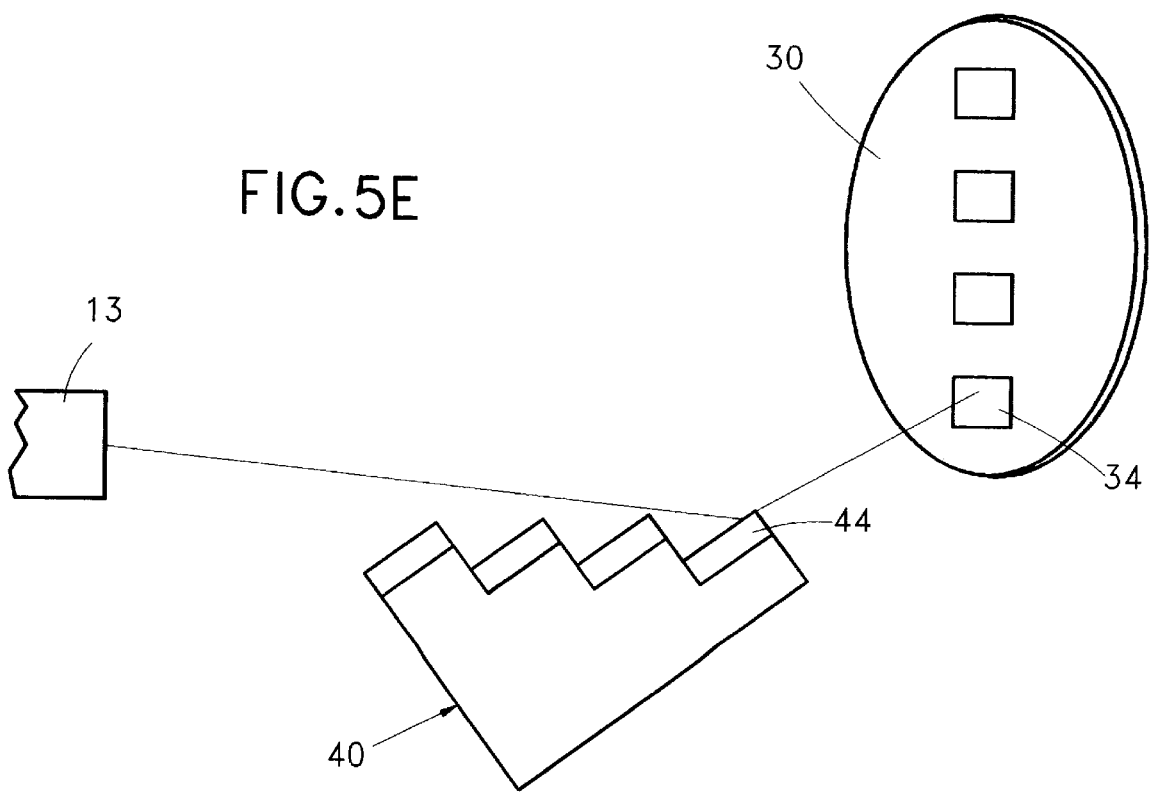

Further displacement of the mirror system in direction Φ results in the incident radiation moving along mirror segment 42, with the reflected radiation moving along mask feature 32, until the incident beam "jumps" from the far edge of mirror segment 42, across dimension H, to the leading edge of mirror segment 43, as shown in FIG. 5d. In so doing, the reflected beam skips over vertical dimension s between mask feature sites 32 and 33. Ultimately, with continual displacement of the mirror system, the incident beam will jump to and traverse mirror segment 44, as shown in FIG. 5e, with the reflected beam correspondingly completing the scan of mask segment 34, thereby completing the exposure cycle.

Figure 6:
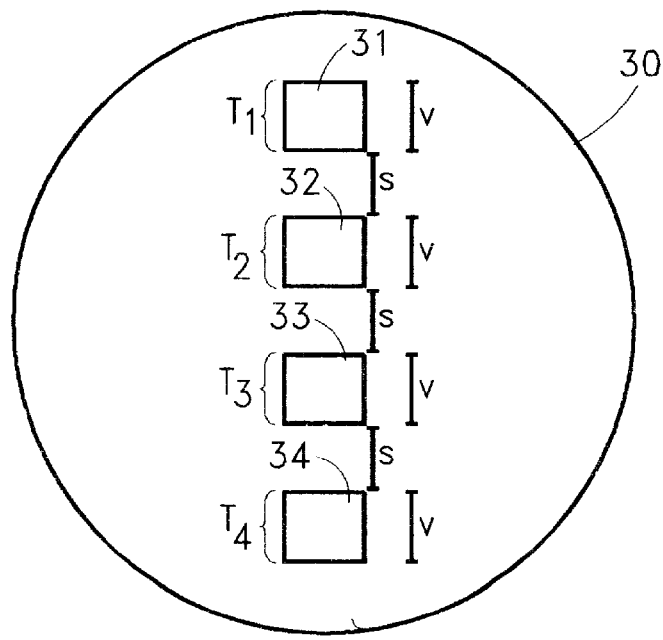
FIG. 6 depicts a mask having patterned areas and opaque areas and the time intervals required to scan the mask areas using an X-ray lithography system having the inventive mirror system.

FIG. 6 provides an overhead view of mask 30, with notation as to the time intervals, $T_x$ during which the patterned mask features are exposed. Mask segment 31, of vertical dimension v, is exposed to reflected radiation during time interval $T_1$, which is the time taken for the incident radiation to traverse the length l of mirror segment 41. The next successive time interval $T_2$ is the time taken for the reflected radiation to traverse mask segment 32, while the incident radiation traverses the length l of mirror segment 42. Similarly, time intervals $T_3$ and $T_4$ correspond to exposure of mask segments 33 and 34, respectively. No elapsed time has been taken to traverse the opaque areas, each of dimension s, during the exposure cycle. By comparing FIG. 3 to FIG. 6, it can be seen that the exposure cycle has become significantly shorter by incorporating the present invention into the lithography system. As noted above, it may be prudent to compensate for potential errors in alignment, such that each time interval $T_x$ denoted in FIG. 6 may be slightly greater than those depicted in FIG. 3 due to an increment added onto mirror segment length l.

It is clear that throughput is enhanced and energy usage maximized due to incorporation of the present inventive mirror system into a lithography tool. In addition, fabrication of uniform, planar, defect-free mirrors for X-ray lithography has been simplified by virtue of the fact that each smaller mirror segment will be considerably easier to produce than the large mirrors required in the past to expose the same size workpiece.

Aside from the advantages cited above of increasing throughput when providing reflected radiation to segmented masks, and facilitating fabrication of the mirror assembly, the present invention lends itself to providing the means for effective small-scale magnification of the image projected by the illuminated segmented mask. For instance, by tilting each of the mirror segments at a small angle relative to the horizontal in FIG. 4 (e.g., each tilted at an angle which is a fraction of a mradian different than the angle of tilt of the adjacent mirror segment), the vertical image projected by each of the segments may be effectively magnified. If the angle of tilt is varied from mirror segment to mirror segment, it may be possible to achieve the effect of piece-wise magnification of the projected image. Likewise, since the individual mirror segments of the present invention are much shorter, in length l, than single mirrors of the prior art, it may be possible to bend a mirror segment to achieve effective magnification of the projected image in the horizontal direction. For either embodiment, it will be understood that the segmented mirror structure would still be displaced in a vertical direction, although such vertical direction would not necessarily be parallel to any of the mirror faces.

While the invention has been described with reference to specific preferred embodiments, it will be clear to one having skill in the art that modifications may be effected without departing from the spirit and scope of the invention as set forth by the appended claims.

Having thus described our invention, what we claim as new and desire to secure by Letters Patent is:

1. A mirror for use in radiation lithography to selectively expose a workpiece through a patterned mask having a plurality of radiation-transparent regions interspersed with at least one opaque region to provide a pattern of exposed areas and non-exposed areas on said workpiece comprising:

a substrate having a plurality of surfaces displaced with respect to each other;

a plurality of mirror segments disposed on said plurality of substrate surfaces wherein the displacement of successive surfaces is proportional to the dimension of a corresponding one of said non-exposed areas on said workpiece, whereby radiation is selectively provided to a plurality of exposed areas on said workpiece; and a plurality of adjusting means coupled to said substrate whereby the displacement of successive surfaces can be adjusted.

2. The mirror of claim 1 wherein said displacement is in the direction perpendicular to the plane of said surfaces.

3. The mirror of claim 2 wherein all of said plurality of surfaces are parallel.

4. The mirror of claim 1 wherein said plurality of mirror segments are parallel.

5. The mirror of claim 4 wherein each of said plurality of mirror segments is planar.

6. A mirror for use in radiation lithoaraphy to expose selected areas of a workpiece to provide a pattern of exposed areas and non-exposed areas on said workpiece comprising:

a first mirror segment;

at least one additional mirror segment displaced with respect to said first mirror segment wherein said displacement causes said radiation to be selectively provided to expose areas of said workpiece; and at least one adjusting means whereby the displacement of said at least one additional mirror segment can be adjusted with respect to the first mirror segment.

7. The mirror of claim 6 wherein said displacement is in the direction perpendicular to the plane of said segments.

8. The mirror of claim 7 wherein said segments are planar.

9. The mirror of claim 6 wherein all of said plurality of mirror segments are parallel.

10. The mirror of claim 8 wherein all of said plurality of mirror segments are parallel.

11. A radiation lithography system for patterning material on a workpiece comprising:

a radiation source;

a mask having a plurality of radiation-transparent regions interspersed with at least one opaque region;

a mirror structure comprising a plurality of mirror segments displaced with respect to each other, wherein the amount of said displacement is proportional to the dimensions of a corresponding one of said at least one opaque region on said mask;

a holder for said workpiece, said holder being positioned with respect to said radiation source and said mirror structure such that radiation incident on said mirror segments is directed onto said workpiece through said radiation-transparent regions of said mask; and a plurality of adjusting means whereby the displacement of said plurality of mirror segments with respect to each other can be adjusted.

12. The system of claim 11 further comprising movably mounted means for positioning said mirror.

13. The system of claim 12 wherein said movably mounted means is adapted to alter the angle of incidence of radiation on said mirror segments.

14. The system of claim 12 wherein said displacement is in the direction perpendicular to the plane of said segments.

15. The system of claim 14 wherein all of said plurality of mirror segments are planar.

16. The system of claim 15 wherein all of said plurality of mirror segments are parallel.

17. The system of claim 12 wherein all of said plurality of mirror segments are parallel.

18. A method for providing radiation to a workpiece surface from a radiation source through a mask having a plurality of radiation-transparent regions interspersed with at least one opaque regions comprising the steps of:

directing radiation onto the first segment of a mirror structure having a plurality of mirror segments displaced with respect to each other to provide reflected radiation at a first radiation-transparent region of said mask;

scanning the length of said first of said plurality of mirror segments;

re-directing said radiation to scan a next successive one of said plurality of mirror segments to provide reflected radiation at a next successive one of said plurality of radiation-transparent regions of said mask;

scanning the length of said next successive mirror segment; and repeating said re-directing and scanning of the length of said next successive mirror segment until all of said plurality of mirror segments have been scanned by said radiation to provide reflected radiation at all of said plurality of radiation-transparent regions of said mask.

19. The method of claim 18 wherein said scanning comprises altering the angle of incidence of said radiation on said mirror segments by angling said mirror segments.

20. The method of claim 18 wherein said re-directing comprises displacing said mirror structure by an amount sufficient to cause said radiation to fall incident on successive segments of said mirror structure.

21. The method of claim 20 wherein said displacing is in the direction perpendicular to the surfaces of said mirror segments.

* * * * *